(12) United States Patent
Ning

(10) Patent No.: US 11,862,229 B2
(45) Date of Patent: Jan. 2, 2024

(54) READING AND WRITING METHOD OF MEMORY DEVICE AND MEMORY DEVICE

(71) Applicant: CHANGXIN MEMORY TECHNOLOGIES, INC., Hefei (CN)

(72) Inventor: Shu-Liang Ning, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 258 days.

(21) Appl. No.: 17/470,879

(22) Filed: Sep. 9, 2021

(65) Prior Publication Data

US 2022/0076730 A1 Mar. 10, 2022

Related U.S. Application Data

(63) Continuation of application No. PCT/CN2021/100676, filed on Jun. 17, 2021.

(30) Foreign Application Priority Data

Sep. 4, 2020 (CN) .......................... 202010919721.8

(51) Int. Cl.
| | | |
|---|---|---|
| *G11C 11/4076* | (2006.01) | |
| *G11C 11/409* | (2006.01) | |
| *G01K 13/00* | (2021.01) | |
| *H01L 25/18* | (2023.01) | |
| *H01L 25/065* | (2023.01) | |

(52) U.S. Cl.
CPC .......... *G11C 11/4076* (2013.01); *G01K 13/00* (2013.01); *G11C 11/409* (2013.01); *H01L 25/0657* (2013.01); *H01L 25/18* (2013.01)

(58) Field of Classification Search
CPC ..... G11C 11/4076; G11C 11/409; G11C 7/04; G01K 13/00; H01L 25/0657; H01L 25/18
USPC ...................................................... 365/185.22
See application file for complete search history.

(56) References Cited

U.S. PATENT DOCUMENTS

| | | | |
|---|---|---|---|
| 7,085,185 | B2 | 8/2006 | Schroder et al. |
| 9,390,785 | B2 | 7/2016 | Halbert |
| 9,465,757 | B2 | 10/2016 | Son et al. |
| 10,878,862 | B2 | 12/2020 | Joo et al. |
| 2005/0018507 | A1 | 1/2005 | Schroder |
| 2014/0359242 | A1 | 12/2014 | Son et al. |
| 2015/0279446 | A1 | 10/2015 | Halbert |
| 2017/0090785 | A1 * | 3/2017 | Kashyap ................ G11C 16/10 |
| 2018/0114550 | A1 * | 4/2018 | Cho .................... G11C 7/22 |
| 2020/0090713 | A1 | 3/2020 | Joo et al. |
| 2020/0159441 | A1 | 5/2020 | Mayer et al. |
| 2021/0074341 | A1 | 3/2021 | Joo et al. |
| 2021/0342242 | A1 * | 11/2021 | Ohno .................... G06F 3/0614 |

FOREIGN PATENT DOCUMENTS

| | | | | |
|---|---|---|---|---|
| CN | 107978329 | A | 5/2018 | |
| CN | 110910927 | A | 3/2020 | |
| WO | WO-2008045856 | A3 * | 7/2008 | .......... G11C 11/406 |
| WO | 2020101975 | A1 | 5/2020 | |

\* cited by examiner

*Primary Examiner* — Fernando Hidalgo

(74) *Attorney, Agent, or Firm* — Cooper Legal Group, LLC

(57) ABSTRACT

A reading and writing method for a memory device and a memory device are provided. The memory device includes a memory chip. The reading and writing method of the memory device includes that: during operation of the memory chip, the temperature of the memory chip is measured, and a writing recovery time of the memory chip is adjusted according to the temperature.

11 Claims, 8 Drawing Sheets

| T | tWR |
|---|---|
| -10℃ | 17 |
| -5℃ | 16 |
| 0℃ | 15 |
| 10℃ | 14 |
| 15℃ | 13 |
| 20℃ | 12 |

FIG. 3

READING AND WRITING METHOD OF MEMORY DEVICE AND MEMORY DEVICE

CROSS-REFERENCE TO RELATED APPLICATION

This application is a continuation application of International Patent Application No. PCT/CN2021/100676, filed on Jun. 17, 2021, which claims priority to Chinese Patent Application No. 202010919721.8, filed on Sep. 4, 2020. The entire contents of International Patent Application No. PCT/CN2021/100676 and Chinese Patent Application No. 202010919721.8 are incorporated herein by reference.

BACKGROUND

A Dynamic Random Access Memory (DRAM) is a commonly used semiconductor memory in computers, and a memory array region of the DRAM is composed of repeated memory cells. Each of the memory cells usually includes a capacitor and a transistor, a gate of the transistor is connected with a word line, a drain of the transistor is connected with a bit line, a source of the transistor is connected with the capacitor, and a voltage signal on the word line may control turning on or turning off of the transistor, so that the data information stored in the capacitor may be read through the bit line, or the data information may be written into the capacitor through the bit line for storage.

Temperature has a great influence on the writing of a memory. Under a low-temperature environment, when writing into the memory, a case that the writing time is longer exists, which may cause next pre-charging and addressing before the previous writing is completed, and thus data written at the previous time would be incomplete, thereby rendering a data loss, and resulting a lower stability of writing.

SUMMARY

This disclosure relates to the field of semiconductor memory, and in particular to a reading and writing method of a memory device and a memory device.

The technical problem to be solved by this disclosure is to provide a reading and writing method of a memory device and a memory device, which may avoid the case that the next pre-charging is performed before the previous writing is completed, and may improve the stability of writing of the memory device.

In order to solve the technical problem above, this disclosure provides a reading and writing method of a memory device. The memory device may include a memory chip. The method includes that: during an operation of the memory chip, a temperature of the memory chip is measured, and a writing recovery time of the memory chip is adjusted according to the temperature.

This disclosure further provides a memory device, including: a memory chip, a temperature detection circuit and a controlling chip. The temperature detection circuit is configured to detect the temperature of the memory chip. The controlling chip is electrically connected to the memory chip and the temperature detection circuit and is configured to adjust the writing recovery time of the memory chip according to the temperature.

BRIEF DESCRIPTION OF THE DRAWINGS

FIG. 3 is a schematic diagram of the correspondences between the temperatures and the writing recovery times.

DETAILED DESCRIPTION

The detailed description of the reading and writing method of a memory device and the memory device in this disclosure will be described below in combination with the drawings.

Figure 1:
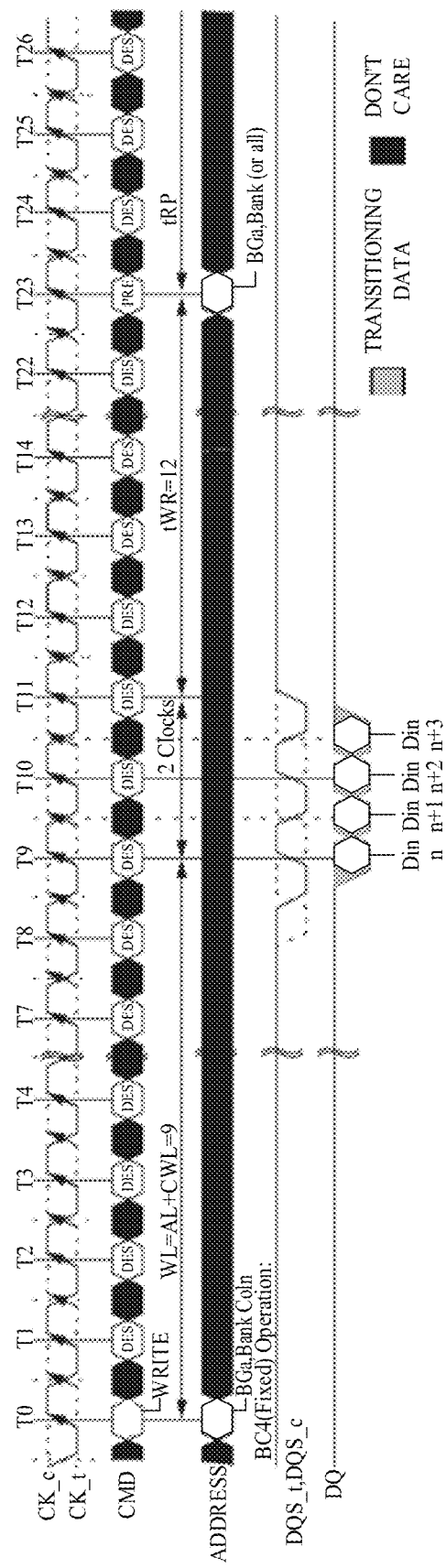
FIG. 1 is a timing diagram of the reading and writing operation of the existing memory device.

FIG. 1 is the timing diagram of the reading and writing operation of the existing memory device. With reference to FIG. 1, in the timing diagram, the writing recovery time tWR is 12, a pre-charging is performed after the writing recovery time tWR, and the pre-charging time is tRP. The writing recovery time tWR is a preset writing recovery time set by the memory device at the time of factory, and cannot be changed.

Moreover, as described in the Background, the temperature has a great influence on the writing of the memory device. Under the low-temperature environment, the actual writing recovery time tWR of the memory device will be prolonged, and will be greater than the preset writing recovery time tWR; if the memory device still executes the operations according to the preset writing recovery time, the next pre-charging and addressing may be performed before the previous writing is completed, so that the data written at the previous time would be incomplete, which results a data loss. Under a high-temperature environment, the actual writing recovery time tWR of the memory device will be shortened, and will be less than the preset writing recovery time tWR; if the memory device still executes the operations according to the preset writing recovery time, the time will be wasted, and the operating speed of the memory device will be decreased.

In view of the reasons above, this disclosure provides a reading and writing method of a memory device, which can change the writing recovery time of the memory device according to the temperature of the memory device, so that the writing recovery time executed by the memory chip is basically consistent with the writing recovery time actually occurred when the memory chip performs the reading and writing operation, thereby avoiding a data loss and a decrease of operation speed.

The reading and writing method of the memory device of this disclosure includes: during the operation of the memory chip, measuring a temperature of the memory chip, and adjusting a writing recovery time of the memory chip according to the temperature.

The temperature of the memory chip is not fixed, which depends on the external environment and a run time of the memory chip itself. The lower the temperature of the external environment, the lower the temperature of the memory chip itself; and the longer the run time, the higher the temperature of the memory chip itself. Therefore, the reading and writing method of the memory device of this disclosure can monitor the temperature of the memory chip in real time, and can adjust the writing recovery time of the memory chip according to the temperature.

In some embodiments of this disclosure, "during the operation of the memory chip" means the period from the time when the memory chip is powered on to the time when the memory chip is powered off.

Figure 2:
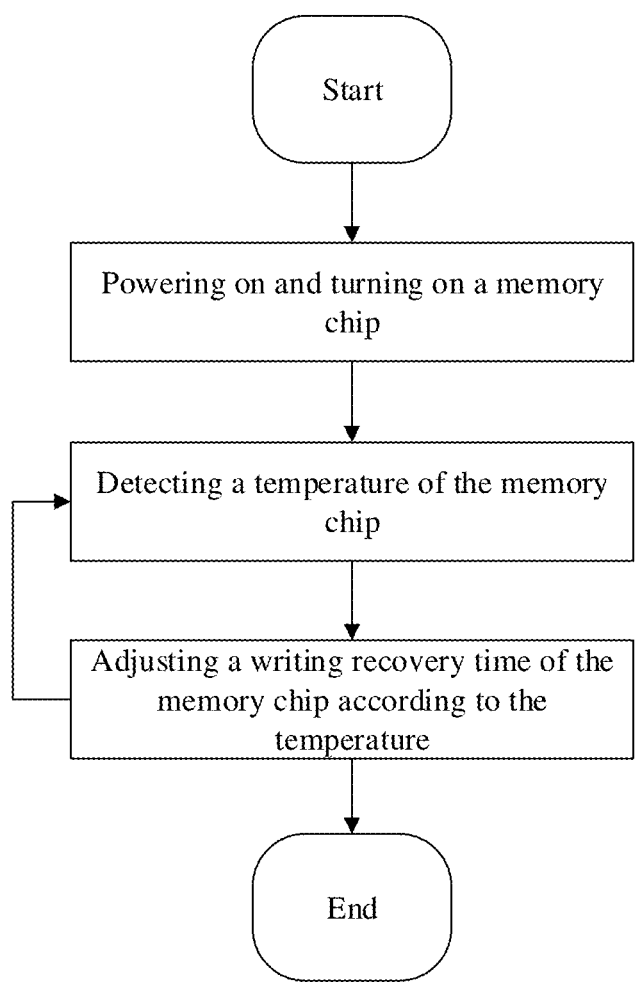
FIG. 2 is a flowchart of the first embodiment of the reading and writing method of the memory device of this disclosure.

FIG. 2 is a flowchart of the first embodiment of the reading and writing method of the memory device of this disclosure. The memory device includes a memory chip and a controlling chip. With reference to FIG. 2, the reading and writing method of the memory device includes the following operations.

The memory chip is powered on. In this operation, the controlling chip applies a voltage to the memory chip to turn on the memory chip. In the embodiment, the memory chip has a default writing recovery time. When the memory chip is turned on, the controlling chip sets the default writing recovery time as a present writing recovery time of the memory chip; and the default writing recovery time can be the writing recovery time preset at the time of factory.

The temperature of the memory chip is detected. In this operation, after the memory chip is powered on, the temperature of the memory chip is detected to obtain a real-time temperature of the memory chip. The temperature of the memory chip can be detected by means of devices such as the temperature detection circuit.

The writing recovery time of the memory chip is adjusted according to the temperature. In this operation, the writing recovery time is prolonged or shortened according to the temperature. When it is detected that the temperature of the memory chip increases, the writing recovery time of the memory chip is shortened; and when it is detected that the temperature of the memory chip decreases, the writing recovery time of the memory chip is prolonged.

Specifically, in the embodiment, when the memory chip is powered on, the controlling chip sets the default writing recovery time as the present writing recovery time of the memory chip. For example, if the default writing recovery time is 12 periods, the present writing recovery time of the memory chip is 12 periods; after the memory chip is turned on, the temperature of the memory chip is detected: if the temperature is higher than the temperature corresponding to the default writing recovery time of the memory chip, the writing recovery time is shortened based on the default writing recovery time and the shortened writing recovery time is set as the present writing recovery time, (for example, the writing recovery time is shortened to 10 periods as the present writing recovery time); or, if the temperature is lower than the temperature corresponding to the default writing recovery time of the memory chip, the writing recovery time is prolonged based on the default writing recovery time and the prolonged writing recovery time is set as the present writing recovery time (for example, the writing recovery time is prolonged to 14 periods as the present writing recovery time).

Further, in the embodiment, correspondences between temperatures and writing recovery times are provided. After measuring the temperature of the memory chip, the writing recovery time corresponding to the temperature is set as the present writing recovery time of the memory chip according to the correspondences between the temperatures and the writing recovery times. The correspondences between the temperatures and the writing recovery times can be preset; for example, when the memory chip is shipped from factory, the correspondences can be preset in the memory chip or the controlling chip. The correspondences between the temperatures and the writing recovery times can be obtained by testing the memory chip.

Figure 3:
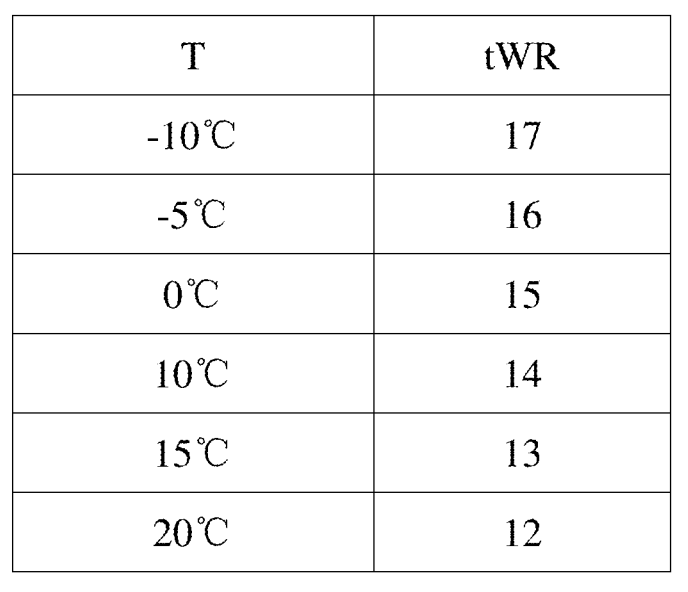

FIG. 3 is a schematic diagram of the correspondences between the temperatures and the writing recovery times. The value thereof is only used for illustrating, and is not used for limiting the disclosure. With reference to FIG. 3, the schematic diagram of the correspondences between the temperatures and the writing recovery times includes a column of temperature T and a column of the writing recovery time tWR. Each temperature corresponds to one writing recovery time. The corresponding writing recovery time is obtained according to the detected temperature of the memory chip, and the corresponding writing recovery time is used as the present writing recovery time of the memory chip. The memory chip executes the operation according to the writing recovery time.

For example, when it is detected that the temperature of the memory chip is 10° C., the writing recovery time corresponding to 10° C. is found in the correspondences; for example, the writing recovery time is 14 periods, the controlling chip sets the 14 periods as the present writing recovery time of the memory chip, and the memory chip executes the operation according to this writing recovery time. When it is detected that the temperature of the memory chip is 20° C., the writing recovery time corresponding to 20° C. is found in the correspondences; for example, the writing recovery time is 12 periods, the controlling chip sets the 12 periods as the present writing recovery time of the memory chip, and the memory chip executes the operation according to this writing recovery time.

Further, in the embodiment, during the operation of the memory chip, the temperature of the memory chip is measured according to the setting period, and the writing recovery time of the memory chip is adjusted according to the temperature. The setting period may be a preset time period after the memory chip is powered on, for example, after the memory chip is powered on, the temperature of the memory chip is measured by using 10 minutes as a setting period, i.e., after the memory chip is powered on, the temperature of the memory chip is measured every ten minutes; or, the temperature of the memory chip is measured by using one hour as a setting period, i.e., after the memory chip is powered on, the temperature of the memory chip is measured every hour.

Further, in another embodiment of this disclosure, during the operation of the memory chip, after the memory chip receives the setting command, the temperature of the memory chip is measured, and the writing recovery time of the memory chip is adjusted according to the temperature. The setting command may be a triggering operation received by the memory chip. For example, an operation for turning off the memory chip, an operation for restarting the memory chip, or a triggering operation that is set by the user or the system and contains an instruction for detecting the temperature of the memory chip, etc., is received by the memory chip. The triggering operation may be any operation that issues a triggering instruction, such as an operation of a user clicking a certain triggering button, or an operation for turning off a certain triggering button, which is not limited by this disclosure.

The reading and writing method of the memory device of this disclosure can adjust the writing recovery time of the memory chip according to the temperature of the memory chip, so that the writing recovery time executed by the memory chip is basically consistent with the writing recovery time actually occurred when the memory chip performs the reading and writing operation, thereby avoiding a data loss and a decrease of operation speed.

Figure 4:
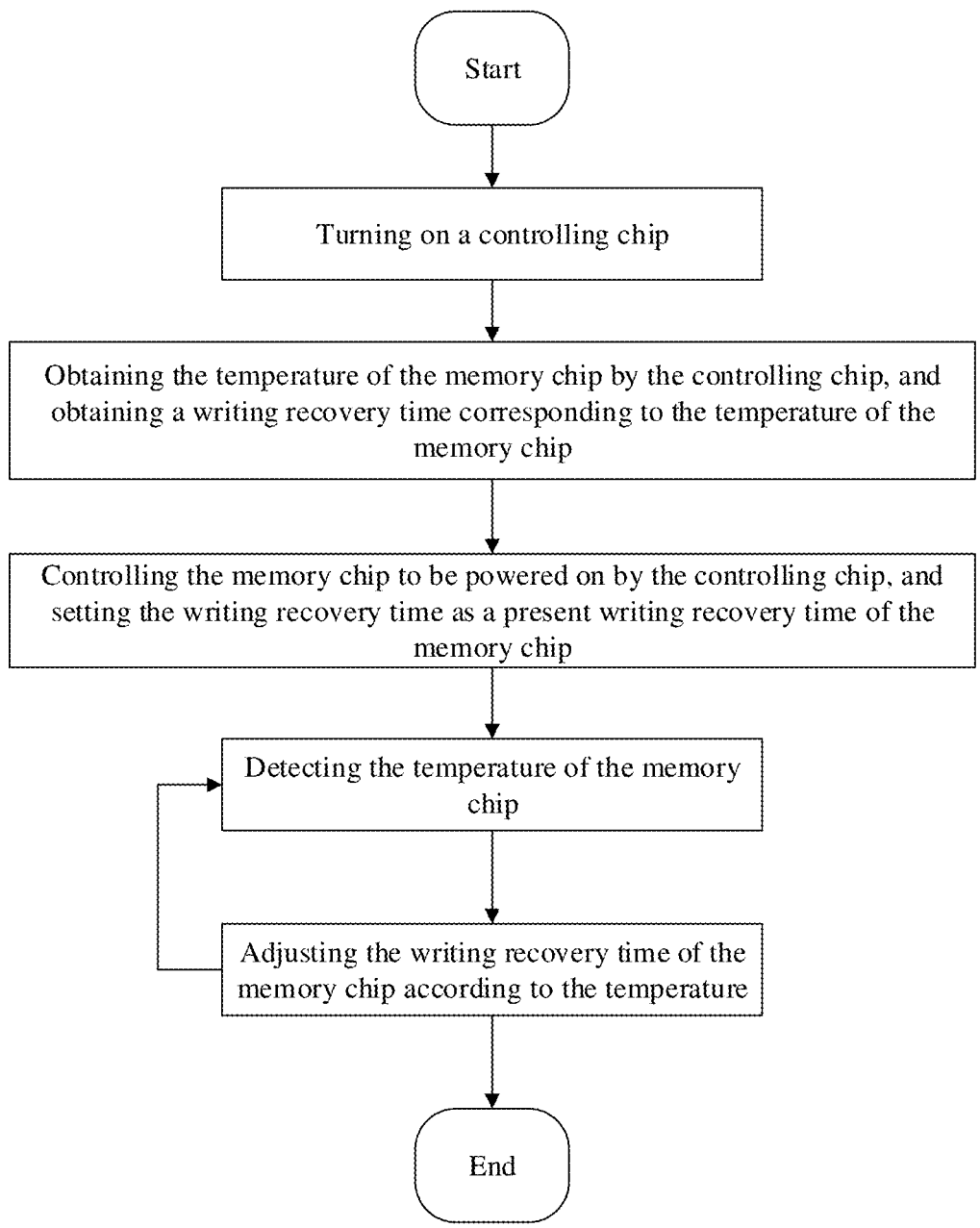
FIG. 4 is a flowchart of the second embodiment of the reading and writing method of the memory device of this disclosure.

In the first embodiment of this disclosure, the memory chip has the default writing recovery time. When the memory chip is turned on, the default writing recovery time is used as the present writing recovery time of the memory chip. Moreover, in another embodiment of this disclosure, when the memory chip is turned on and the default writing recovery time is not used as the present writing recovery time, the temperature of the memory chip is detected before the memory chip is turned on, and the writing recovery time corresponding to the detected temperature is used as the present writing recovery time of the memory chip. Specifically, with reference to FIG. 4, which is a flowchart of the second embodiment of the reading and writing method of the memory device of this disclosure, before the memory chip is powered on, the controlling chip is turned on. The controlling chip obtains the temperature of the memory chip, and obtains the writing recovery time corresponding to the temperature of the memory chip. The controlling chip controls the memory chip to be powered on, and uses the writing recovery time as the present writing recovery time of the memory chip. In the embodiment, the writing recovery time of the memory chip is adjusted according to the temperature before the memory chip is turned on, so as to enable the writing recovery time obtained when the memory chip is turned on to be the actually required writing recovery time, and to avoid errors.

Figure 5:
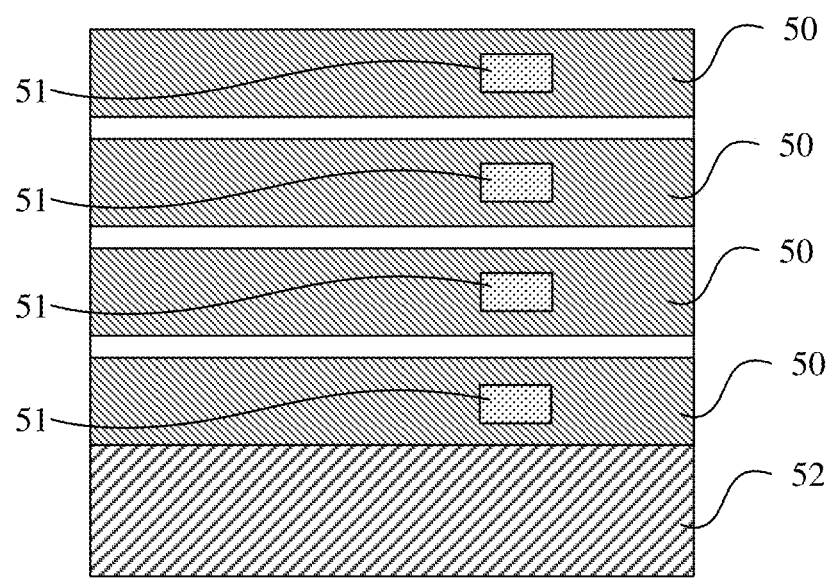
FIG. 5 is a schematic structural diagram of the first embodiment of the memory device of this disclosure.

This disclosure further provides a memory device adopting the above reading and writing method. FIG. 5 is a schematic structural diagram of the first embodiment of the memory device of this disclosure. With reference to FIG. 5, the memory device includes a memory chip 50, a temperature detection circuit 51, and a controlling chip 52.

The memory chip 50 is an existing memory capable of performing data writing, data reading and/or data deletion, and the memory chip 50 is formed through a semiconductor integrated manufacturing process. Specifically, the memory chip 50 may include a memory array and a peripheral circuit connected with the memory array. The memory array includes multiple memory cells and bit lines, word lines and metal connecting lines (metal contact parts) which are connected with the memory cells. The memory cells are configured to store data, and the peripheral circuit is a related circuit when the memory array is operated. In the embodiment, the memory chip 50 is a DRAM chip, the DRAM chip includes multiple memory cells, each of the memory cells usually includes a capacitor and a transistor, a gate of the transistor is connected with a word line, a drain of the transistor is connected with a bit line, and a source of the transistor is connected with the capacitor. In other embodiments, the memory chip 50 may be other types of memory chips.

The temperature detection circuit 51 is configured to detect the temperature of the memory chip 50. The temperature detection circuit 51 includes a temperature sensor. The temperature sensor is configured to sense the temperature, and convert the sensed temperature into an electrical signal. The temperature sensor may be a PN junction diode temperature sensor or a capacitive temperature sensor.

The memory device includes one or more memory chips 50 and one or more temperature detection circuits 51. The temperature detection circuit 51 can be configured to detect the temperatures of one or more memory chips 50. The temperature detection circuit 51 and the memory chips 50 may be in a one-to-one relationship or one-to-more relationship.

In the embodiment, the memory device includes multiple memory chips 50 and multiple temperature detection circuits 51. The multiple memory chips 50 are provided in a stacked manner. There exists a one-to-one correspondence between the temperature detection circuits 51 and the memory chips 50. FIG. 5 schematically illustrates four memory chips 50 and four temperature detection circuits 51.

The controlling chip 52 is electrically connected to the memory chip 50 and the temperature detection circuit 51. The controlling chip 52 is configured to control the turn-on and the operations of the memory chip 50 and the temperature detection circuit 51, and the controlling chip 52 is also configured to adjust the writing recovery time of the memory chip 50 according to the temperature of the memory chip 50 detected by the temperature detection circuit 51.

Further, the memory device includes a look-up table. The look-up table records correspondences between temperatures and writing recovery times. The controlling chip 52 can adjust the writing recovery time of the memory chip 50 according to the records of the look-up table. The look-up table can be stored in the memory chip 50 and also can be stored in the controlling chip 52.

Multiple memory chips 50 are provided on the controlling chip 52 in a stacked manner. The controlling chip 52 is bonded with the memory chip 50 at the bottommost in the stacked structure. Moreover, in another embodiment of this disclosure, when there is only one memory chip 50, the memory chip 50 is provided on the controlling chip 52, and the controlling chip 52 is bonded with the memory chip 50.

Further, the temperature detection circuit 51 may be formed in the memory chip 50 through a semiconductor integrated manufacturing process. If the temperature detection circuit 51 is only configured to detect the temperature of one memory chip 50, the temperature detection circuit 51 may be formed in the memory chip 50. For example, in the present embodiment, as shown in FIG. 5, the temperature detection circuits 51 and the memory chips 50 have a one-to-one correspondence, and one temperature detection circuit 51 is disposed in each of the memory chip 50. If the temperature detection circuit 51 is configured to detect the temperatures of multiple memory chips 50, the temperature detection circuit 51 may be formed in any memory chip 50 of multiple the memory chips 50 or formed in the middle or bottommost memory chip 50. For example, in the second embodiment of this disclosure, with reference to FIG. 6, which is a schematic structural diagram of the second embodiment of the memory device of this disclosure, the temperature detection circuit 51 is provided in the bottommost memory chip 50 and can measure the temperature of the four memory chips 50.

In another embodiment of this disclosure, the temperature detection circuit 51 is not provided in the memory chip 50, but is provide in the controlling chip 52. Specifically, with reference to FIG. 7, which is a schematic structural diagram of the third embodiment of the memory device of this disclosure, the temperature detection circuit 51 is provided in the controlling chip 52 and can measure the temperature of the four memory chips 50 stacked provided on the controlling chip 52.

Figure 6:
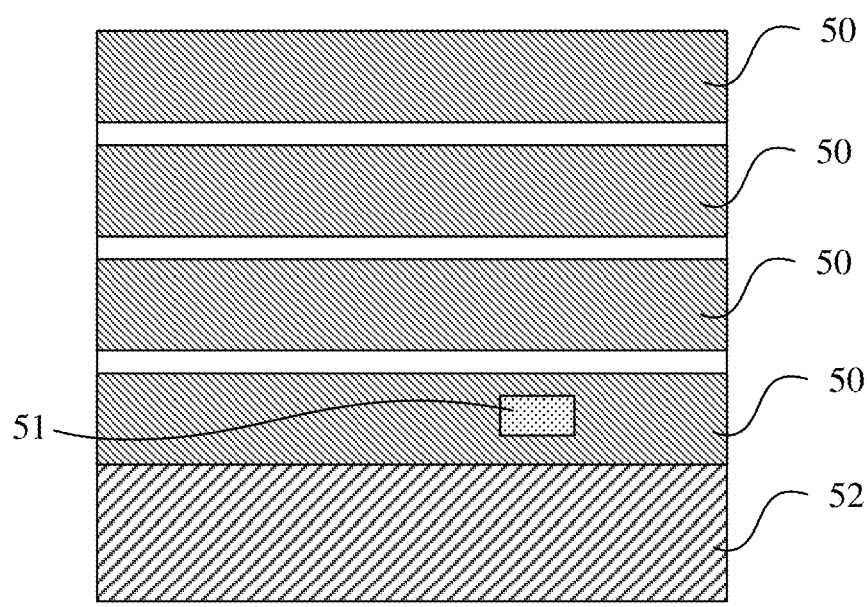
FIG. 6 is a schematic structural diagram of the second embodiment of the memory device of this disclosure.
Figure 7:
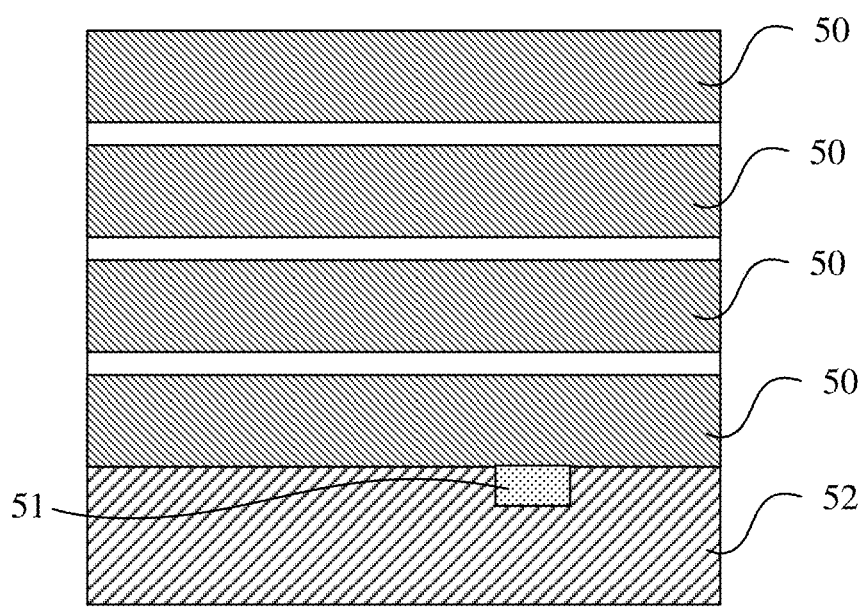
FIG. 7 is a schematic structural diagram of the third embodiment of the memory device of this disclosure.
Figure 8:
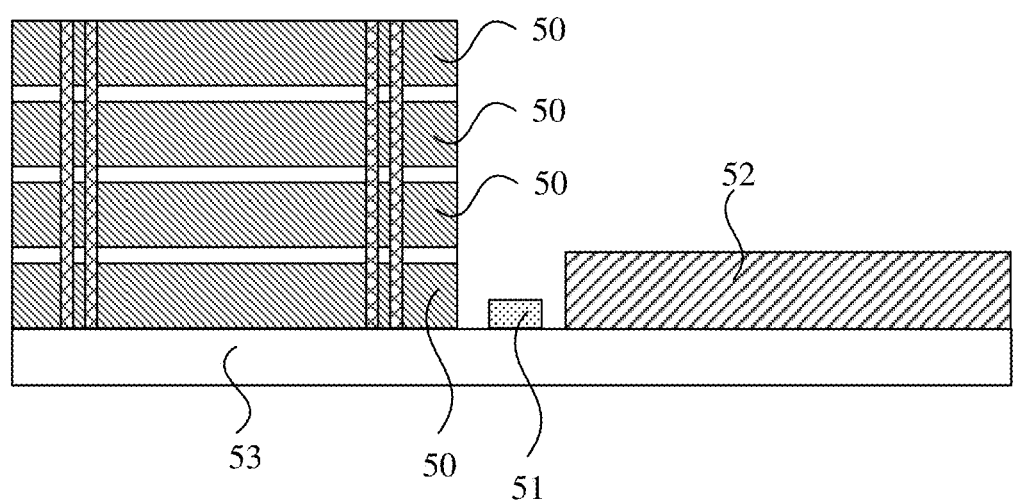
FIG. 8 is a schematic structural diagram of the fourth embodiment of the memory device of this disclosure.

In another embodiment of this disclosure, with reference to FIG. 8, which is a schematic structural diagram of the fourth embodiment of the memory device of this disclosure, the memory device further includes the circuit substrate 53; the circuit substrate 53 has the connecting lines (not shown in the drawings); the memory chip 50 and the controlling chip 52 are both located on the circuit substrate 53; the memory chip 50 and the controlling chip 52 are electrically connected through the connecting lines in the circuit substrate 53. In the embodiment, the temperature detection circuit 51 is also provided on the circuit substrate 53 to measure the environmental temperature, and the environmental temperature is close to the temperature of the memory chip 50 and can be approximately used as the temperature of the memory chip 50. The circuit substrate 53 includes, but is not limited to, a Printed Circuit Board (PCB). It can be understood that in other embodiment of this disclosure, the temperature detection circuit 51 may not be provided on the circuit substrate 53, and may be provided in the memory chip 50 or in the controlling chip 52 as shown in FIG. 5, FIG. 6, and FIG. 7.

Further, by means of a Through Silicon Via (TSV) interconnect structure, the memory chip 50 and the controlling chip 52 can be electrically connected, and the temperature detection circuit 51 and the controlling chip 52 can be electrically connected. Specifically, when multiple memory chips 50 are provided in a stacked manner, each memory chip 50 can be connected to the controlling chip 52 by means of different TSV interconnect structures. When there are multiple temperature detection circuits 51, there exists a case that each of the temperature detection circuit 51 is connected to the controlling chip 52 through different TSV interconnect structures, or a case that the multiple temperature detection circuits 51 are connected to the controlling chip 52 through a shared TSV interconnect structure. It can be understood that the memory chip 50 and the temperature detection circuit 51 are connected to the controlling chip 52 through different TSV interconnect structures, so that the temperature detection circuits 51 and the memory chips 50 can be powered by using different power sources.

Further, the power supply of multiple the temperature detection circuits 51 can also share the TSV interconnect structure. The memory device of this disclosure can detect the temperature of the memory chip, and can adjust the writing recovery time of the memory chip according to the temperature, so that the writing recovery time executed by the memory chip is basically consistent with the writing recovery time actually occurred when the memory chip performs a reading and writing operation, thereby avoiding a data loss and a decrease of operation speed.

The foregoing descriptions are merely preferred embodiments of this application. It should be noted that those skilled in the art can make various improvements and modifications to this application without departing from the scope of this application. These improvements and modifications should also be within the protection scope of this application.

The invention claimed is:

1. A reading and writing method of a memory device, the memory device comprising a memory chip, a temperature detection circuit and a controlling chip electrically connected to the memory chip and the temperature detection circuit, and the reading and writing method comprising the following sequential steps:
    turning on the controlling chip;
    detecting, by the temperature detection circuit, a temperature of the memory chip;
    obtaining, by the controlling chip, the temperature of the memory chip and obtaining, by the controlling chip, a writing recovery time corresponding to the temperature;
    controlling, by the controlling chip, the memory chip to be powered on, and setting, by the controlling chip, the writing recovery time corresponding to the temperature as a present writing recovery time of the memory chip;
    during operation of the memory chip, detecting, by the temperature detection circuit, the temperature of the memory chip; and
    adjusting, by the controlling chip, the writing recovery time of the memory chip according to the temperature detected during the operation of the memory chip.

2. The reading and writing method of the memory device of claim 1, wherein adjusting, by the controlling chip, the writing recovery time of the memory chip comprises: prolonging, by the controlling chip, the writing recovery time; or shortening, by the controlling chip, the writing recovery time.

3. The reading and writing method of the memory device of claim 2, further comprising:
    when the temperature of the memory chip increases, shortening, by the controlling chip, the writing recovery time; or
    when the temperature of the memory chip decreases, prolonging, by the controlling chip, the writing recovery time.

4. The reading and writing method of the memory device of claim 1, further comprising:
    providing correspondences between temperatures and writing recovery times; and
    after detecting, by the temperature detection circuit, the temperature of the memory chip, setting, by the controlling chip, the writing recovery time corresponding to the temperature as the present writing recovery time of the memory chip according to the correspondences between the temperatures and the writing recovery times.

5. The reading and writing method of the memory device of claim 4, wherein the correspondences between the temperatures and the writing recovery times are preset.

6. The reading and writing method of the memory device of claim 1, wherein during the operation of the memory chip, the temperature of the memory chip is detected by the temperature detection circuit according to a setting period, and the writing recovery time of the memory chip is adjusted by the controlling chip according to the temperature.

7. The reading and writing method of the memory device of claim 1, wherein during the operation of the memory chip, after receiving a setting command by the memory chip from a user, the temperature of the memory chip is detected by the temperature detection circuit, and the writing recovery time of the memory chip is adjusted by the controlling chip according to the temperature.

8. A memory device, comprising:
    a memory chip, a temperature detection circuit and a controlling chip electrically connected to the memory chip and the temperature detection circuit, wherein
    the controlling chip is configured to be turned on;
    the temperature detection circuit is configured to detect a temperature of the memory chip before the memory chip is powered on; and
    the controlling chip is further configured to:
        obtain the temperature of the memory chip and obtain a writing recovery time corresponding to the temperature; and
        control the memory chip to be powered on, and set the writing recovery time corresponding to the temperature as a present writing recovery time of the memory chip,
    wherein the temperature detection circuit is further configured to detect the temperature of the memory chip during operation of the memory chip; and the controlling chip is further configured to adjust the writing recovery time of the memory chip, according to the temperature detected during the operation of the memory chip.

9. The memory device of claim 8, wherein the memory device further comprises a look-up table; the look-up table records correspondences between temperatures and writing recovery times; and the controlling chip is further configured to adjust the writing recovery time of the memory chip according to a record of the look-up table.

10. The memory device of claim 8, wherein the temperature detection circuit is provided in the memory chip or the controlling chip.

11. The memory device of claim 8, wherein the memory device further comprises a circuit substrate; the circuit substrate comprises connecting lines; the memory chip and the controlling chip are both located on the circuit substrate; the memory chip and the controlling chip are electrically connected through the connecting lines in the circuit substrate; and the temperature detection circuit is provided on the circuit substrate.

\* \* \* \* \*